United States Patent
Enchi et al.

(10) Patent No.: US 6,455,099 B1
(45) Date of Patent: Sep. 24, 2002

(54) METHOD AND DEVICE FOR APPLYING SEALANT TO IC HAVING BUMPS

(75) Inventors: Kouhei Enchi, Osaka; Hiroyuki Yoshida, Kadoma; Yoshifumi Kitayama, Hirakata, all of (JP)

(73) Assignee: Matsushita Electric Industrial Co., Ltd. (JP)

(*) Notice: Subject to any disclaimer, the term of this patent is extended or adjusted under 35 U.S.C. 154(b) by 0 days.

(21) Appl. No.: 09/763,162
(22) PCT Filed: Aug. 13, 1999
(86) PCT No.: PCT/JP99/04402
§ 371 (c)(1),
(2), (4) Date: Feb. 16, 2001
(87) PCT Pub. No.: WO00/11710
PCT Pub. Date: Mar. 2, 2000

(30) Foreign Application Priority Data

Aug. 20, 1998 (JP) ............................................. 10-233360

(51) Int. Cl.⁷ ............................. B05D 5/12; B05B 3/00
(52) U.S. Cl. ........................ 427/96; 427/287; 118/323
(58) Field of Search ......................... 427/58, 96, 256, 427/284, 286, 287; 118/663, 696, 712, 300, 323

(56) References Cited

U.S. PATENT DOCUMENTS 5,129,213 A * 7/1992 Hatakeyama ................. 53/432

FOREIGN PATENT DOCUMENTS

| JP | 169157 | * 6/1994 |
| JP | 7-37916 | 2/1995 |
| JP | 10-50769 | 2/1998 |

* cited by examiner

Primary Examiner—Brian K. Talbot
(74) Attorney, Agent, or Firm—Parkhurst & Wendel, LLP

(57) ABSTRACT

A method and a device for applying a sealant to an IC having bumps, which can solve a cobwebbing problem when a dispense nozzle is raised after the sealant has been applied and implement a productivity improvement; specifically, a method and a device for applying a sealant to an IC having bumps, wherein a dispense nozzle (12) is raised in a first stage (E) at a low speed simultaneously with the stop of dispensing until the first stage (E) covers a specified height and then it is raised in a second stage (F) at a high seed. The above design, in which the dispense nozzle (12) is raised in the first stage (E) at a low speed after the application of the sealant (2) and the nozzle (12) is then raised at a high speed and in a short time in the second stage (F), can positively break off the sealant (2) without inducing cobwebbing and enhance productivity.

5 Claims, 4 Drawing Sheets

(a)

HORIZONTAL MOVEMENT TO APPLICATION POSITION | LOWERING | APPLICATION | FIRST SPEED RAISE | SECOND SPEED RAISE (b)

(a) PRIOR ART (b) PRIOR ART

METHOD AND DEVICE FOR APPLYING SEALANT TO IC HAVING BUMPS

FIELD OF THE INVENTION

The present invention relates to a method and a device for applying a sealant to an IC having bumps, which are utilized for application of a sealant after an IC having bumps and a pattern of a circuit substrate have been connected by a flip technique.

BACKGROUND OF THE PRESENT INVENTION

Hereafter, a conventional method and a conventional device for applying a sealant to an IC having bumps and a device for applying a sealant to an IC having bumps will be described with reference to FIGS. 3 and 4. Here, FIG. 3 shows a perspective view of a device for applying a sealant to an IC having bumps, and FIG. 4 shows an operation view of a dispensing nozzle. FIG. 4(a) is a flow chart showing an application operation of the dispensing nozzle, and FIG. 4(b) is a timing chart diagram showing the application operation of the dispensing nozzle, where the vertical movement of the dispensing nozzle and the "ON" and "OFF" of the dispenser are placed on the vertical axis, and the time axis is placed on the lateral axis.

As a conventional method for applying a sealant to an IC chip having bumps, in a step of sealing after an IC having bumps and a pattern of a circuit substrate have been connected by the flip technique, a device 30 for applying a sealant to an IC having bumps has a dispenser 31 for applying the sealant, and has a nozzle head robot 33 that moves the dispensing nozzle 32 in a vertical direction, an X-axis robot 34 for moving the head in a horizontal X-direction, and a Y-axis robot 35 that moves the substrate in a horizontal Y-direction, as shown in FIG. 3.

On drawing a line on sides or along a periphery of the IC, the dispensing nozzle 32 is first moved in a horizontal direction by the X-axis robot 34 and the Y-axis robot 35 and is disposed to face an application position A of the substrate 36 in a distance such that the nozzle head of the dispensing nozzle does not hit the end face of the IC, as shown in FIGS. 4(a) and 4(b). Next, at that position, the dispensing nozzle 32 is lowered in a direction of the arrow B at a constant lowering speed ($V_1$=200 mm/s) by the nozzle head robot 33 to a height such that a gap distance H between the nozzle and the substrate 36 or the IC in the vertical direction is approximately 0.2 ±0.1 mm.

Then, after the lowering is completed, the dispensing nozzle 32 starts an application movement in a direction of the arrow C ($V_D$=20 mm/s) while maintaining a predetermined distance (horizontal direction) with the side face of the IC, and at the same time the dispensing is turned "ON" (with ± variations in timing), whereby a force P that extrudes the sealant 37 is allowed to act on the dispensing nozzle 32, and the extruded sealant 37 is applied onto the substrate 36. After it is moved for a predetermined distance in such a state of applying the sealant 37, i.e. after the horizontal application operation is completed, the dispensing is turned "OFF", and at the same time the dispensing nozzle 32 is raised in an arrow D direction at a constant speed by the nozzle head robot 33.

In other words, in the prior art, they were a method for applying a sealant to an IC bump and a device for applying a sealant to an IC having bumps, which perform a one-stage raising operation of raising at a constant speed for completion.

However, by such a one-stage raising operation utilized in the prior art, after a sealant 37 having a viscosity of 30 poise or more (middle to high viscosity) is applied, the dispensing nozzle 32 rises at a constant speed (typically at a high speed of about 200 mm/S) simultaneously with the turning "OFF" of dispensing (with ± variations in timing), whereby a cobwebbing 37a of the sealant 37 is generated, the sealant 37 falls onto a place where the sealant 37 must not be present in the original function (for example, the upper face of the IC is contaminated, or the face of the pattern on the substrate 36 that must not be contaminated is contaminated), and deterioration of the function and appearance of the IC substrate is occurred. Also, if the raising speed is set at a low speed of about 5 to 10 mm/S, the raising time requires as much as 3 seconds or more, and this has a disadvantage of lack in productivity.

The present invention solves the above mentioned problems, and its object is to provide a method for applying a sealant to an IC having bumps and a device for applying a sealant to an IC having bumps that can solve the inconvenience caused by cobwebbing at the time of raising the nozzle head after application, and can achieve an improvement in productivity.

DISCLOSURE OF THE INVENTION

In order to achieve the above mentioned object, the method for applying a sealant to an IC having bumps according to the present invention is constructed in such a manner that: a first stage of raising a dispensing nozzle at a first speed, which is a low speed, is carried out after dispensing is turned "OFF" and application is finished; a second stage of raising the dispensing nozzle at a second speed, which is a speed higher than the first speed, is performed after the first stage raising is performed for a certain distance; and the raising speed is sequentially increased in a stepwise manner for multiple times by such a method.

By this method, the raising speed of the dispensing nozzle increases in a stepwise manner after the application of the sealant, so that such an inconvenience as is caused by cobwebbing which is seen in the prior art can be solved by the low speed raising at the initial stage, the period of time required for the whole raising step can be shortened by the high speed at the later stage, and the improvement of productivity can be achieved as well.

Also, the raising speed of the dispensing nozzle at each stage is not constant, and may be variable according to material properties (mainly viscosity) and application diameter of the sealant, and an optimal raising speed can be selected in accordance with the viscosity and the application amount of the sealant.

Also, filling with the sealant can be reliably performed and the sealant application time can be efficiently shortened since the method is characterized in that timing of starting the application of the sealant is simultaneous with that of starting movement of the dispensing nozzle, and timing of raising the dispensing nozzle is simultaneous with that of finishing the application of the sealant.

Further, the present invention also discloses a device for applying a sealant to an IC, which enables implementation of the above mentioned method for applying a sealant to an IC having bumps. That is to say, the device for applying a sealant has a dispenser for applying the sealant, a nozzle head robot that moves the dispensing nozzle in a vertical direction, an X-axis robot that moves a head axis of the dispensing nozzle in a horizontal X-direction, and a Y-axis robot that moves the substrate in a horizontal Y-direction, and is characterized in that the nozzle head robot is constructed to perform the raising of the dispensing nozzle through a plurality of stages with different speeds, after the application of the sealant has been completed.

The device operates as follows. The dispensing nozzle is moved in the X-direction by the X-axis robot and the substrate is moved in the Y-direction by the Y-axis robot in order to dispose the nozzle head of the dispensing nozzle to face an application position of the substrate with such a distance that the nozzle head does not hit the end face of the IC. Next, the dispensing nozzle is lowered at a constant speed by the nozzle head robot to a height such that a predetermined gap distance between the nozzle and the substrate or the IC in the vertical direction is generated. Then, after the lowering is completed, the dispensing nozzle is moved for application while maintaining a predetermined distance from the side face of the IC, and the dispensing is turned "ON" to extrude the sealant from the dispensing nozzle and to allow the extruded sealant to be applied onto the substrate. After the application of the sealant is completed, the dispensing is turned "OFF", and the dispensing nozzle is raised through a plurality of stages with different speeds by the nozzle head robot. The sealant is broken by the low speed raising in the former stage, and the dispensing nozzle is raised at a high speed by the high speed raising in the latter stage.

PREFERRED EMBODIMENTS

Embodiment 1

Figure 1:
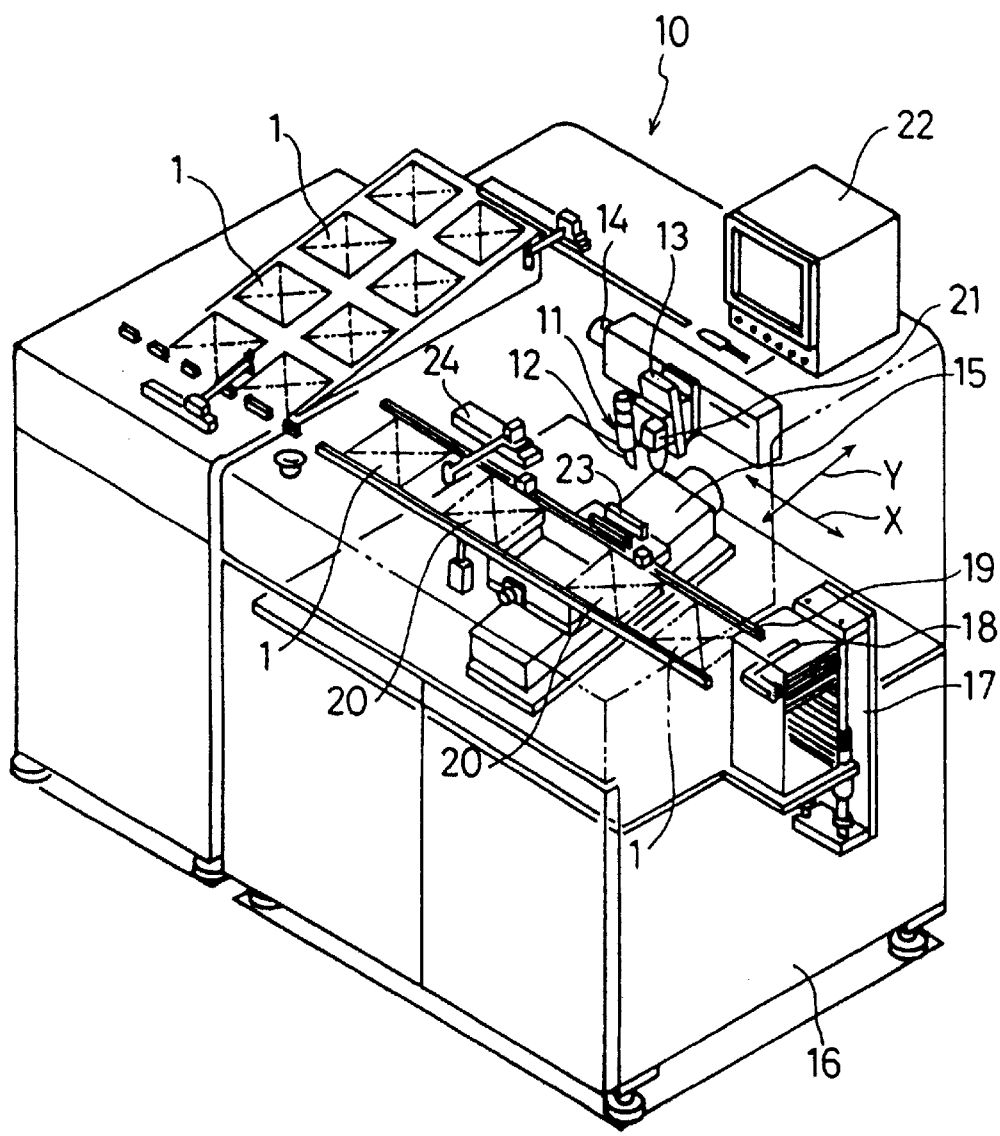
FIG. 1 is a perspective view that illustrates a device for applying a sealant to an IC having bumps according to Embodiment 1 of the present invention.
Figure 2:
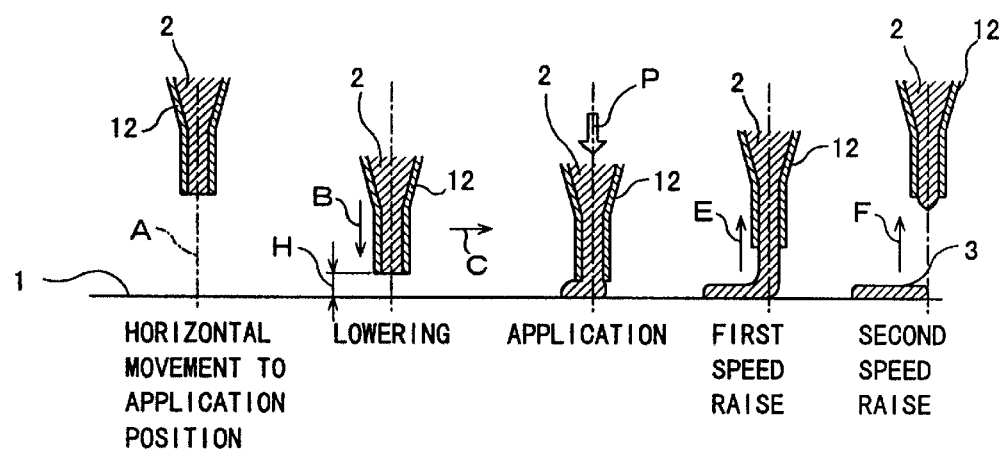
FIG. 2 is an operation view of a dispensing nozzle according to Embodiment 1 of the present invention, wherein (a) is a flow chart that illustrates an application operation of a dispensing nozzle and (b) is a timing chart diagram that illustrates the application operation of the dispensing nozzle.
Figure 2:
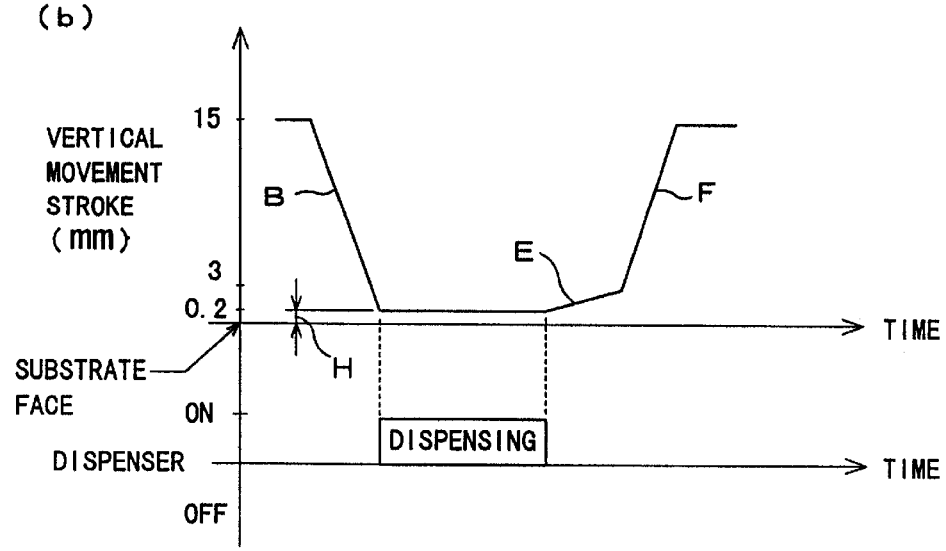
Figure 3:
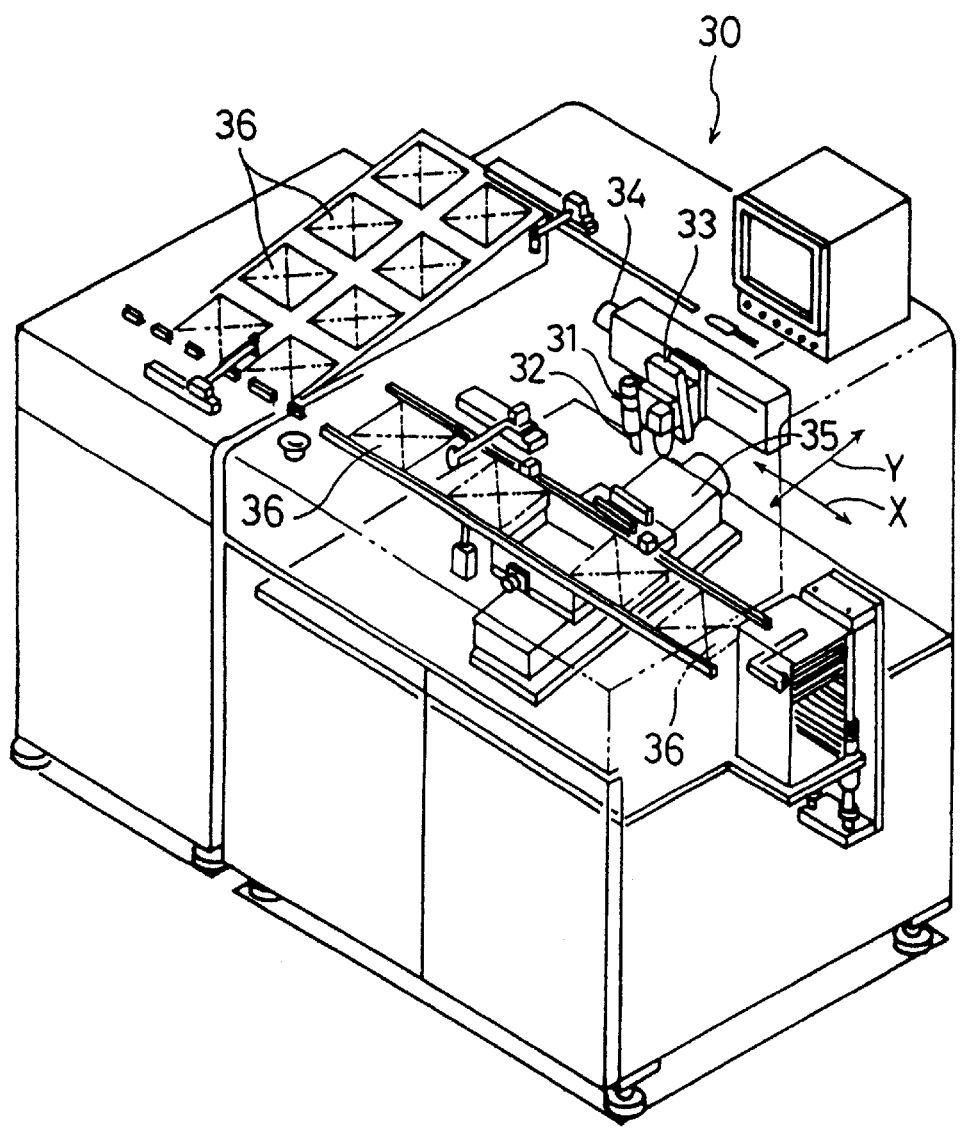
FIG. 3 is a perspective view that illustrates a device for applying a sealant to an IC having bumps according to a conventional example.
Figure 4:
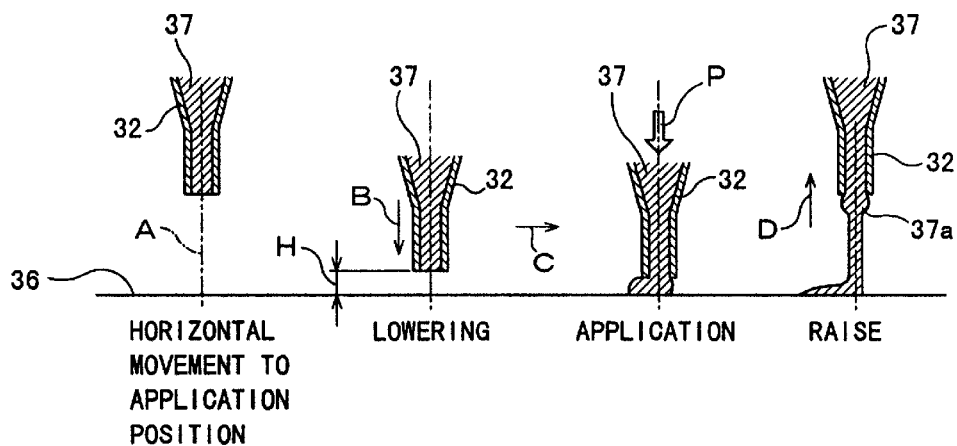
FIG. 4 is an operation view of a dispensing nozzle according to the conventional example, wherein (a) is a flow chart that illustrates an application operation of a dispensing nozzle and (b) is a timing chart diagram that illustrates the application operation of the dispensing nozzle.
Figure 4:
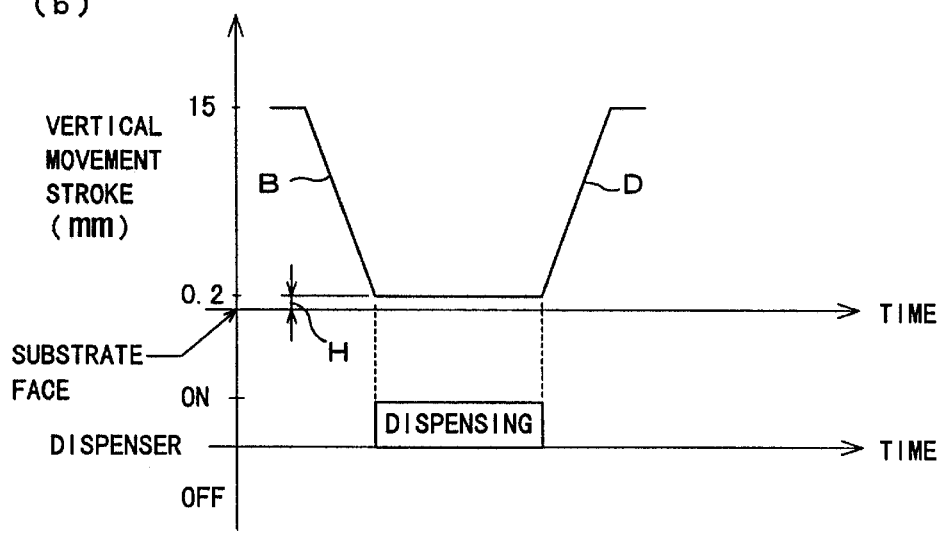

Hereafter, a method and a device for applying a sealant to an IC having bumps, which constitute Embodiment 1 of the present invention, will be described with reference to FIGS. 1 and 2. Here, FIG. 1 shows a perspective view of a device for applying a sealant to an IC having bumps, and FIG. 2 shows an operation of a dispensing nozzle. FIG. 2(a) is a flow chart showing an application operation of the dispensing nozzle, and FIG. 2(b) is a timing chart diagram showing the application operation of the dispensing nozzle, in which coordinates a vertical movement stroke of the dispensing nozzle and "ON" and "OFF" states of the dispenser are taken along the ordinate, and a time axis is taken along the abscissa.

Referring to FIG. 1, the device 10 for applying a sealant to an IC having bumps has a dispenser 11 for applying the sealant, and has a nozzle head robot 13 that moves a dispensing nozzle (feeding nozzle) 12 in a vertical direction, an X-axis robot 14 that moves the head axis in a horizontal X-direction, and a Y-axis robot 15 that moves a substrate 1 in a horizontal Y-direction. Further, the above mentioned nozzle head robot 13 is configured to raise the dispensing nozzle 12 through a plurality of stages with different speeds after the application of the sealant has been completed.

Here, in FIG. 1, the numeral 1 represents a substrate on which an IC having bumps is flipped, 16 represents a frame of the device 10 for applying a sealant to an IC having bumps, 17 represents a loader magazine lifting part, 18 represents a unit for drawing in the substrate, 19 represents a loader rail, 20 represents an application stage, 21 represents a camera for recognition of ICs and substrate marks, 22 represents a TV monitor, 23 represents an application nozzle cleaning unit, and 24 represents a unit for pushing out the substrate.

In the above mentioned Embodiment 1, on drawing a line on sides or along a periphery of the IC, the dispensing nozzle 12 is first moved relatively in a horizontal direction by the X-axis robot 14 and the Y-axis robot 15 and is disposed to face an application position A of the substrate 1 with a distance such that the nozzle head of the dispensing nozzle does not hit the end face of the IC, as shown in FIGS. 2-(a) and 2(b). Next, at that position, the dispensing nozzle 12 is lowered in a direction of the arrow B at a constant lowering speed ($V_1$=200 mm/s) by the nozzle head robot 13 to a height such that a gap distance H between the nozzle and the substrate 1 or the IC in the vertical direction is about 0.2 ±0.1 mm.

Then, after the lowering is completed, the dispensing nozzle 12 starts an application movement in a direction of the arrow C ($V_D$=20 mm/s) while maintaining a predetermined horizontal distance from the side face of the IC, and at the same time the dispensing is turned "ON" (with ± variations in timing), whereby a force P that extrudes the sealant 2 is allowed to act on the dispensing nozzle 12, and the extruded sealant 2 is applied onto the substrate 1. After it is moved for a predetermined distance in such a state of applying the sealant 2, that is, after the horizontal application operation is completed, the dispensing is turned "OFF", and at the same time, the dispensing nozzle 12 is raised by the nozzle head robot 13.

At that time, the raising is performed through a plurality of stages with different speeds. In other words, simultaneously with the turning "OFF" of the dispensing after completion of the horizontal application operation, the dispensing nozzle 12 is subjected to a first stage raising E (with ± variations in timing) at a constant low speed ($V_2$=about 5 mm/s). After this first stage raising E has been performed for a certain distance (the gap distance H being about 3 mm) (after completion of the first stage raising), the dispensing nozzle 12 is subjected to a second stage raising F at a constant high speed ($V_3$=200 mm/s). This can apply the sealant 3 onto the substrate 1 without generating a cobwebbing.

Thus, at the time of raising the dispensing nozzle 12 after the sealant 2 has been applied, the dispensing nozzle 12 is first subjected to the first stage raising at a low speed, whereby the sealant 2 can be broken without generating any cobwebbing so as to solve the inconvenience caused by cobwebbing. Thereafter, the dispensing nozzle 12 is subjected to the second stage raising at a high speed, whereby the raising can be carried out in a short period of time to realize an improvement in productivity.

Here, in the above described Embodiment 1, the speeds of raising the dispensing nozzle 12, both in the low speed and in the high speed, have been shown respectively as constant speeds ($V_2$=about 5 mm/s, $V_3$=200 mm/s); however, they are not limited to these constant speeds, but are variable in accordance with material properties and application diameter of the sealant.

In the foregoing, such an expression is used as is saying turning the dispensing "ON". This expression refers to the start of application of the sealant. Also, such an expression is used as is saying turning the dispensing "OFF", which refers to the end of application of the sealant.

As described above, according to the present invention, advantageous effects are obtained so that inconvenience caused by cobwebbing can be solved and an improvement in productivity can be realized by having a raising operation of a plurality of stages with different speeds at the time of raising the dispensing nozzle after the sealant has been applied.

What is claimed is:

1. A method for applying a sealant to an IC having bumps, characterized by:

lowering a dispensing nozzle of a dispenser until a gap distance between the nozzle and a substrate or an IC becomes identical with a predetermined height H;

subsequently moving the dispensing nozzle for a predetermined distance, while maintaining a constant horizontal distance from a side face of the IC and drawing a line on sides or along a periphery of the IC by extruding and applying sealant from the dispensing nozzle;

performing a first stage of raising the dispensing nozzle at a first speed after the application of the sealant has been finished; and performing a second stage of raising the dispensing nozzle at a second speed higher than the first speed, after the first stage raising has been performed for a certain distance.

2. The method for applying a sealant to an IC having bumps according to claim 1, characterized in that each speed for raising the dispensing nozzle is variable in accordance with material properties and application diameter of the sealant.

3. The method for applying a sealant to an IC having bumps according to claim 1, characterized in that timing of starting applying the sealant is simultaneous with that of starting the movement of the dispensing nozzle while maintaining the constant horizontal distance with the side face of the IC.

4. The method for applying a sealant to an IC having bumps according to claim 1, characterized in that timing of raising the dispensing nozzle is simultaneous with that of finishing the application of the sealant.

5. A device for applying a sealant to an IC having bumps, in which a sealant is applied after an IC having bumps and a pattern of a circuit substrate have been connected, comprising:

a dispenser for applying the sealant;

a nozzle head robot for moving the dispensing nozzle in a vertical direction;

an X-axis robot for moving a head axis of the dispensing nozzle in a horizontal X-direction; and a Y-axis robot for moving the substrate in a horizontal Y-direction, characterized in that said nozzle head robot is configured to perform raising of the dispensing nozzle through a plurality of stages with different speeds, after the application of the sealant has been completed.

* * * * *